United States Patent
Shirasaki et al.

(10) Patent No.: US 10,361,063 B2
(45) Date of Patent: Jul. 23, 2019

(54) CHARGED PARTICLE DETECTOR AND CHARGED PARTICLE BEAM DEVICE USING THE SAME

(71) Applicant: Hitachi, Ltd., Chiyoda-ku, Tokyo (JP)

(72) Inventors: Yasuhiro Shirasaki, Tokyo (JP); Momoyo Enyama, Tokyo (JP); Kaori Shirahata, Tokyo (JP); Makoto Sakakibara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/918,464

(22) Filed: Mar. 12, 2018

(65) Prior Publication Data

US 2018/0261425 A1    Sep. 13, 2018

(30) Foreign Application Priority Data

Mar. 13, 2017    (JP) .................................. 2017-047453

(51) Int. Cl.
| | |
|---|---|
| *H01J 37/00* | (2006.01) |
| *H01J 37/244* | (2006.01) |
| *H01J 37/20* | (2006.01) |
| *H01J 37/28* | (2006.01) |
| *H01J 37/10* | (2006.01) |

(52) U.S. Cl.
CPC ............ *H01J 37/244* (2013.01); *H01J 37/10* (2013.01); *H01J 37/20* (2013.01); *H01J 37/28* (2013.01); *H01J 2237/2443* (2013.01); *H01J 2237/2448* (2013.01)

(58) Field of Classification Search
CPC .......... H01J 37/244; H01J 37/10; H01J 37/20; H01J 37/28; H01J 2237/2443; H01J 2237/2448
USPC ................. 250/336.1, 370.01, 370.1, 370.11
See application file for complete search history.

(56) References Cited

FOREIGN PATENT DOCUMENTS

| JP | 2000-258539 A | | 9/2000 |
|---|---|---|---|
| JP | 2000258539 | * | 9/2000 |

* cited by examiner

*Primary Examiner* — Michael Maskell
(74) *Attorney, Agent, or Firm* — Crowell & Moring LLP

(57) ABSTRACT

A charged particle detector including a scintillator that is irradiated with charged particles, a fluorescent film being in contact with a first surface facing a second surface of the scintillator, the second surface being irradiated with the charged particles, and a photodetector that detects luminescence of the fluorescent film, wherein the fluorescent film has a plurality of regions, the plurality of regions respectively have phosphors that absorb luminescence of the scintillator and emit light with different wavelengths from one another, and a charged particle beam device using the charged particle detector.

14 Claims, 11 Drawing Sheets

CHARGED PARTICLE DETECTOR AND CHARGED PARTICLE BEAM DEVICE USING THE SAME

CLAIM OF PRIORITY

The present application claims priority from Japanese patent application JP 2017-047453 filed on Mar. 13, 2017, the content of which is hereby incorporated by reference into this application.

BACKGROUND OF THE INVENTION

1. Field of the Invention

The present invention relates to a charged particle detector and a charged particle beam device using the same, and more particularly to a charged particle detector for detecting a position irradiated with a charged particle beam and intensity of the charged particle beam and a charged particle beam device using the charged particle detector.

2. Description of the Related Art

Detectors that detect charged particles are used to convert particle signals such as electrons and ions that are invisible to the eyes into light, voltages, current signals, and the like. For example, in a charged particle beam device such as a scanning electron microscope (SEM) using a charged particle beam such as an electron beam, a signal to be detected is charged particles such as electrons, and a charged particle detector is indispensable. The SEM irradiates a sample to be observed with an electron beam generated from an electron source, thereby to generate secondary electrons. The charged particle detector outputs a current according to the amount of detected secondary electrons. An SEM image is formed by two-dimensionally displaying a relationship between a current amount and an irradiation position on the sample, of the electron beam.

Many of such charged particle detectors are configured from a fluorescent plate (hereinafter referred to as scintillator) for converting secondary electrons into light and a photodetector for detecting light from the fluorescent plate and converting the light into a current. The charged particle detector in the charged particle beam device such as the SEM may have a configuration capable of specifying an arrival position of the charged particles to the detector for information discrimination. For example, since there is a difference in the direction into which the secondary electrons are emitted depending on the material and shape of the sample, information of the material and shape of the sample can be obtained by detecting an emission angle of secondary electrons from the sample.

JP 2000-258539 A discloses an example in which a powdery scintillator is mixed with a coloring matter having different emission wavelengths according to the arrival position of radiation and a scintillator that emits light with different wavelengths is used. By selecting the wavelength of this detection light with a color filter, a radiation irradiation position in the scintillator can be specified.

SUMMARY OF THE INVENTION

As described above, in the charged particle beam device such as the SEM, sample information is included in the arrival position of the secondary electrons to the detector, and thus more information about the sample can be obtained by confirming which position of the detector is irradiated with the secondary electrons. To confirm the arrival position of the secondary electrons, it is conceivable to provide a plurality of charged particle detectors or to provide a two-dimensional detector such as a charge coupled device (CCD). However, there are problems that the cost of the detector increases, an extra space is required for arranging the enlarged detector, and the like. Therefore, an inexpensive and compact charged particle detector capable of detecting the arrival position of secondary electrons is desired.

There are two conditions for a charged particle detector for measuring emission angle distribution of secondary electrons. First, the first condition will be described. In a case of measuring the angle distribution of secondary electrons in the vicinity of the sample, it is necessary to arrange the charged particle detector in a limited space of several mm between the sample and the objective lens, and there is space limitation. That is, it is desirable that the charged particle detector is compact. This is the first condition.

The second condition relates to the type of scintillator that can be used for the charged particle detector. In the SEM, there is a time difference from when the sample is irradiated with the electron beam to when the secondary electrons are detected, and the time difference needs to be small in order to acquire the SEM image without deteriorating resolution. To make the time difference small, it is desirable that a response speed of the scintillator is high. In a case of a general acquisition rate of the SEM image, it is desirable that the response speed of the scintillator is about 100 ns or more. Also, to increase a signal-to-noise ratio, it is desirable that electron-light conversion efficiency is high and is stable in order to improve image reproducibility. From the above, the second condition is to use a scintillator of a type having a fast response speed and high electron-light conversion efficiency, and is resistant to environmental variation in electron beam, light irradiation, temperature and degree of vacuum.

Those that satisfy the two conditions and are capable of detecting the arrival position of secondary electrons with one detector are referred to as position discrimination detectors in this specification. However, types of scintillators that satisfy the second condition and have different emission wavelengths are very limited, and thus realization of a position discrimination detector with high spatial resolution is difficult. Also, since the scintillator's electron-light conversion efficiency and resistance to charged particle beams depend on the material, quantitative comparison of signal amounts using a scintillator made of a plurality of materials is difficult. Furthermore, JP 2000-258539 A describes that a single type of powder scintillator is mixed with a coloring matter having different emission wavelengths to change an emission color for each incident position. However, the technology is inappropriate for a position discrimination detector used for a charged particle beam device from the viewpoint of response speed and resistance of the coloring matter to irradiation of the charged particle beam. In particular, a coloring matter containing an organic compound rich in emission wavelength is deteriorated by irradiation with a charged particle beam for several minutes.

A charged particle detector including a scintillator that is irradiated with charged particles, a fluorescent film being in contact with a surface facing a surface of the scintillator, the surface being irradiated with the charged particles, and a photodetector configured to detect luminescence of the fluorescent film, wherein the fluorescent film has a plurality of regions, each of the plurality of regions absorbs luminescence of the scintillator, and the fluorescent film has phosphors that emit light at different wavelengths from one another, and a charged particle beam device using the charged particle detector.

A charged particle detector that measures an arrival position of a charged particle beam with good reproducibility, and a charged particle beam device using the charged particle detector are realized.

DESCRIPTION OF THE PREFERRED EMBODIMENTS

Figure 1:
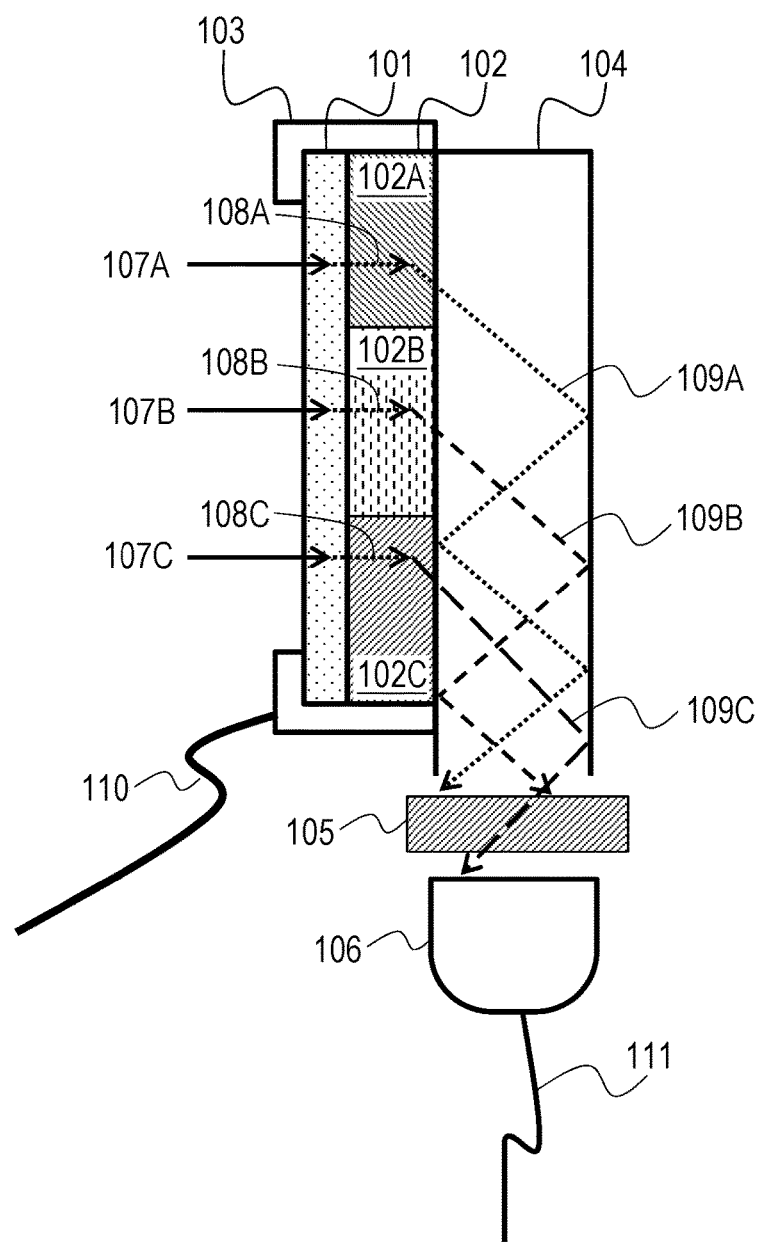
FIG. 1 is a diagram illustrating a schematic configuration of a charged particle detector.

Hereinafter, embodiments will be described with reference to the drawings. Note that, in all the drawings for describing the embodiments, the same elements are denoted with the same reference numeral, and repetitive description thereof is omitted. Hereinafter, embodiments in detecting electron beams will be described. However, effects of the present invention are not lost even in the case of using ion beams or radiation.

First Embodiment

FIG. 1 is a diagram illustrating a schematic configuration of a charged particle detector. First, a configuration of the detector will be described. The detector includes a scintillator 101 that converts incident electron beams 107A to 107C into lights 108A to 108C, a fluorescent film 102 provided in contact with the scintillator and which converts the lights 108A to 108C into lights 109A to 109C having another wavelength, a housing 103 covering peripheries of the scintillator 101 and the fluorescent film 102, a waveguide 104 that propagates light 109 generated from the fluorescent film 102, a color filter 105 capable of selecting transmittance according to a wavelength of a light, and a photodetector 106 that detects a light transmitted through the color filter 105. A final output of the charged particle detector is an output of the photodetector 106 and is output via an output cable 111. In a case where a surface irradiated with an electron beam 107 is a surface of the scintillator 101, the fluorescent film 102 is in close contact with a back surface of the scintillator 101. Further, the waveguide 104 is in close contact with the fluorescent film 102, and efficiently guides the light generated by the fluorescent film 102 to the color filter 105.

A method of detecting an electron arrival position in the present charged particle detector will be described. When the scintillator 101 is irradiated with the electron beams 107A to 107C, the lights 108A to 108C are generated at respective irradiation positions. Since the lights are converted by the same scintillator, the wavelengths of the lights 108A to 108C are the same. When the lights 108A to 108C are emitted from the scintillator 101, the lights 108A to 108C enter the fluorescent film 102. The fluorescent film 102 is a phosphor containing an organic compound and includes phosphors 102A to 102C having different emission wavelengths depending on positions. Here, an inorganic phosphor can be used as the phosphor but there is a limitation on available wavelengths. In FIG. 1, the fluorescent film 102 is divided into three different regions of the phosphors. The spatial resolution as a position discrimination detector is increased as the regions are more finely divided. Therefore, it is desirable to use an organic compound having high wavelength selectivity as the phosphor.

The lights 108A to 108C are absorbed by the phosphors 102A to 102C and become the lights 109A to 109C having different wavelengths depending on positions, that is, the phosphors that have absorbed the lights. Since an energy loss is caused in the phosphors 102A to 102C until the phosphors absorb the light and emit light, energy of the lights 109A to 109C is equal to or lower than energy of the lights 108A to 108C. This means that the wavelengths of the lights 109A to 109C are longer than the wavelength of the lights 108A to 108C. Therefore, to make the wavelengths of the lights 109A to 109C visible, the wavelength of the lights 108A to 108C emitted by the scintillator 101 is set to be blue or ultraviolet having a shorter wavelength than the wavelengths of the lights 109A to 109C.

The lights 109A to 109C are emitted from the fluorescent film 102 and enter the waveguide 104. The lights 109A to 109C having entered the waveguide 104 are guided to the color filter 105 by repetition of scattering and reflection. The color filter 105 transmits only light having a specific wavelength out of the lights 109A to 109C, and light having other wavelengths is absorbed or reflected. In the example of FIG. 1, the color filter 105 is capable of selecting a wavelength to transmit. FIG. 1 illustrates an example in which the lights 109A and 109B are absorbed and the light 109C is transmitted. The light 109C transmitted through the color filter 105 is detected by the photodetector 106. This means that only the electron beam 107C is detected by the photodetector 106. The electron beam 107A or 107B can be detected by the photodetector 106 by switching the wavelength that is transmitted through the color filter 105. Switching of the color filter 105 may be manually or automatically performed. By selecting the transmission wavelength of the color filter 105 and individually detecting the electron beams 107A to 107C with the photodetector 106, intensity distribution of the electron beams 107A to 107C can be measured.

Since the fluorescent film 102 contains an organic compound, a part of the structure is destroyed and deteriorated when the fluorescent film 102 is irradiated with the electron beam, and the luminous efficiency is reduced. Therefore, the fluorescent film 102 is covered with the scintillator 101 and the housing 103 so that the fluorescent film 102 is not directly irradiated with the electron beam 107 and scattered electron beams of the electron beam 107. To prevent the electron beam 107 from being transmitted through the scintillator 101 and radiating the fluorescent film 102, the film thickness of the scintillator 101 is set to be larger than a penetration depth of the electron beam for the scintillator 101, which is obtained from the Kanaya-Okayama equation shown in (Equation 1).

[Equation 1]

$$R = \frac{27.6 \times E^{1.67} A}{\rho Z^{0.89}}$$ (Equation 1)

Here, R is the penetration depth [nm] of electrons, E is electron energy [keV], A is atomic weight, ρ is density [g/cm³], and Z is atomic number.

Further, the fluorescent film 102 that is an insulating film is deteriorated when charged. Since the scintillator 101 and the housing 103 have conductivity, deterioration of the fluorescent film 102 due to charging is suppressed by discharging to an outside through a conductive wire 110. Further, a voltage may be applied to the scintillator 101 using the conductive wire 110 to float the entire detector. With the configuration, incident energy of the electron beam 107 to the scintillator 101 can be can be made high, and thus the electron-light conversion efficiency of the scintillator 101 can be improved.

Figure 2:
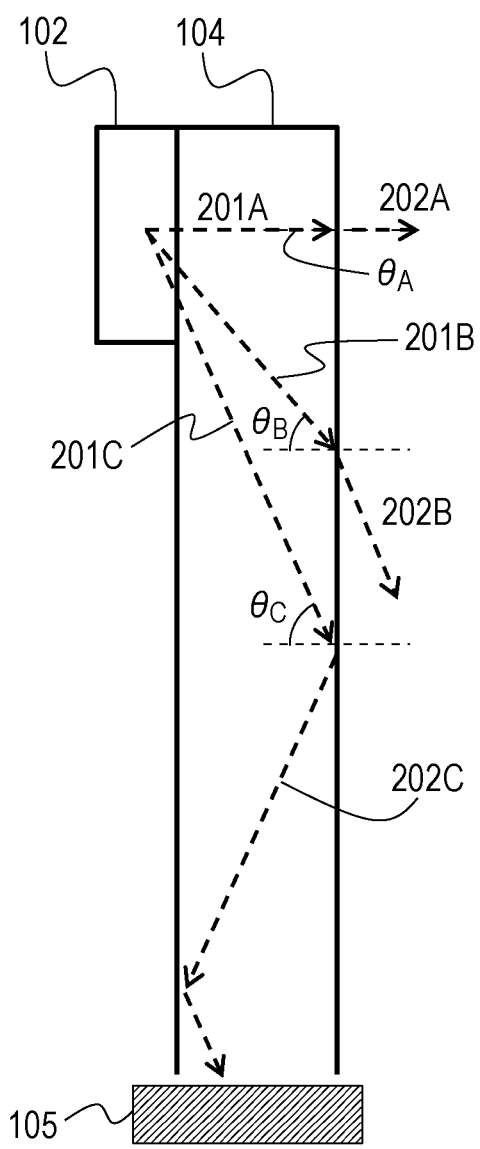
FIG. 2 is a diagram illustrating a configuration of a waveguide.

Next, a configuration of the waveguide 104 will be described with reference to FIG. 2. FIG. 2 illustrates how lights 201A to 201C generated at a certain point of the fluorescent film 102 are propagated in the waveguide 104. The lights generated in the fluorescent film 102 enter the waveguide 104 at various angles. The lights 201A to 201C enter the waveguide 104 at different angles and impinge on a side wall of the waveguide 104 at angles $\theta_A$ to $\theta_C$. Since there is a difference in refractive index n between an inside and an outside at the side wall of the waveguide as the boundary, the light is reflected and propagated in the waveguide 104 when the angle impinging on the side wall is larger than a critical angle $\theta_0$ shown in (Equation 2).

[Equation 2]

$$\theta_0 = \arcsin\left(\frac{1}{n}\right)$$ (Equation 2)

Here, $\theta_0$ is the critical angle, and n is the refractive index of the waveguide.

Since the incident angle $\theta_C$>the critical angle $\theta_0$, the light 201C is propagated in the waveguide 104 as a light 202C. On the other hand, since the incident angle $\theta_A$ of the light 201A and the incident angle $\theta_B$ of the light 201B satisfy the incident angle $\theta_A$<the critical angle $\theta_0$ and the incident angle $\theta_B$<the critical angle $\theta_0$, respectively, the lights 201A and 201B leak out of the waveguide 104 as lights 202A and 202B. Note that the material of the waveguide 104 is glass, and another material such as plastic is also applicable as long as the material does not absorb light having a target wavelength. Further, as the waveguide 104, a fiber bundle in which optical fibers are bundled may be used.

Note that, in the examples in FIGS. 1 and 2, the photodetector 106 is arranged in a direction perpendicular to a travel direction of the electron beam 107. However, the photodetector 106 may be provided in the travel direction of the electron beam 107, and the waveguide may be provided between the fluorescent film and the photodetector. Further, the waveguide 104 may be formed in a curved shape instead of a straight line, and a propagating direction of the light 201 and the arrangement of the photodetector 106 may be changed.

Figure 3A:
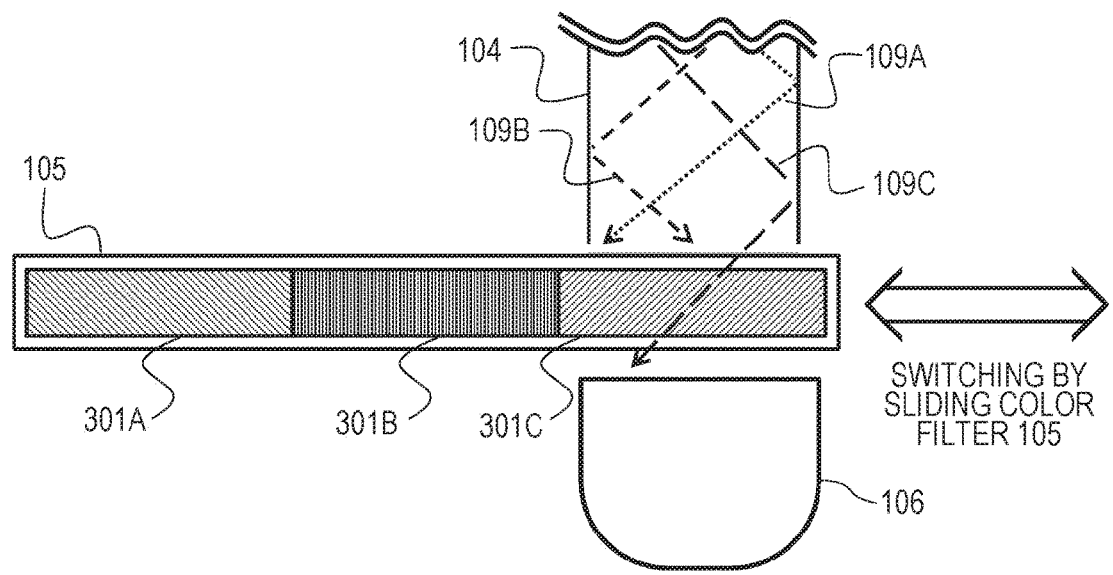
FIG. 3A is a diagram for describing selection of detection light by a color filter.
Figure 3B:
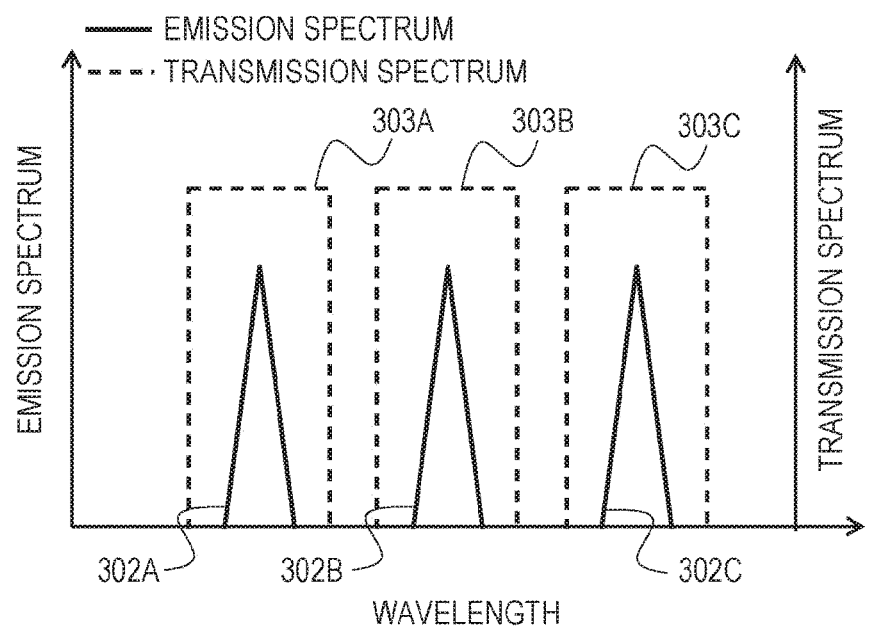
FIG. 3B is a diagram illustrating wavelength dependency of emission spectra and transmission spectra.

Next, a method of selecting a wavelength of the light 109, using the color filter 105 will be described with reference to FIGS. 3A and 3B. FIG. 3A illustrates an enlarged diagram of a vicinity of the color filter 105 in FIG. 1. The lights 109A to 109C propagated in the waveguide 104 enter the color filter 105. The color filter 105 is configured from three different wavelength filters 301A to 301C corresponding to the three emission wavelengths of the fluorescent film in the example of FIG. 1. By sliding the color filter 105 in a cross direction and switching the color filter, the color filter arranged between the waveguide 104 and the photodetector 106 can be selected from the wavelength filters 301A to 301C. FIG. 3B illustrates wavelength dependency of emission spectra of the lights 109A to 109C and transmission spectra of the wavelength filters 301A to 301C. Emission spectra 302A to 302C are emission spectra of the lights 109A to 109C, and transmission spectra 303A to 303C are transmission spectra of the wavelength filters 301A to 301C, respectively. In the present embodiment, as the phosphors 102A to 102C, phosphors having distributions of the emission spectra 302A to 302C not overlapping with each other are used. Further, as for the transmission spectra 303A to 303C, only the emission spectra 302A to 302C are transmitted. That is, the wavelength filters 301 are provided by the number of the phosphors 102A to 102C. FIG. 3A illustrates a case where the wavelength filter 301C is selected. The lights 109A and 109B are absorbed by the wavelength filter 301C, and only the light 109C is transmitted through the wavelength filter 301C and is detected by the photodetector 106. Similarly, by selecting the wavelength filter 301A or the wavelength filter 301B with the color filter 105, only the light 109A or 109B can be detected by the photodetector 106.

Figure 4A:
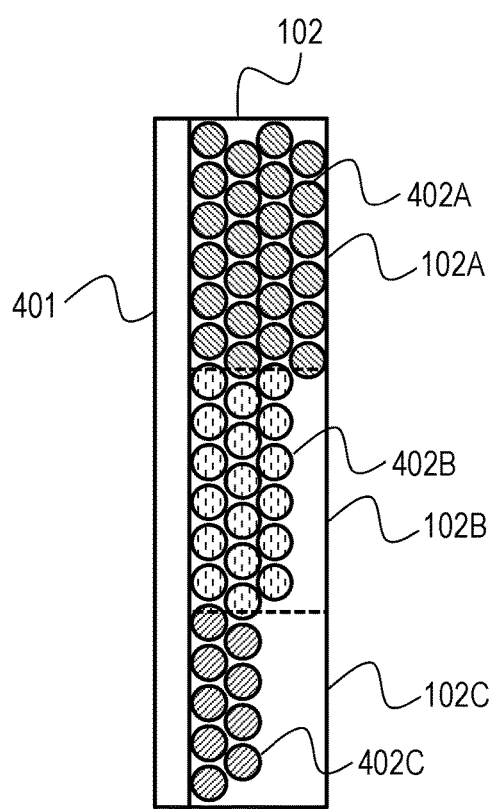
FIG. 4A is a diagram for describing a configuration of a fluorescent film.
Figure 4B:
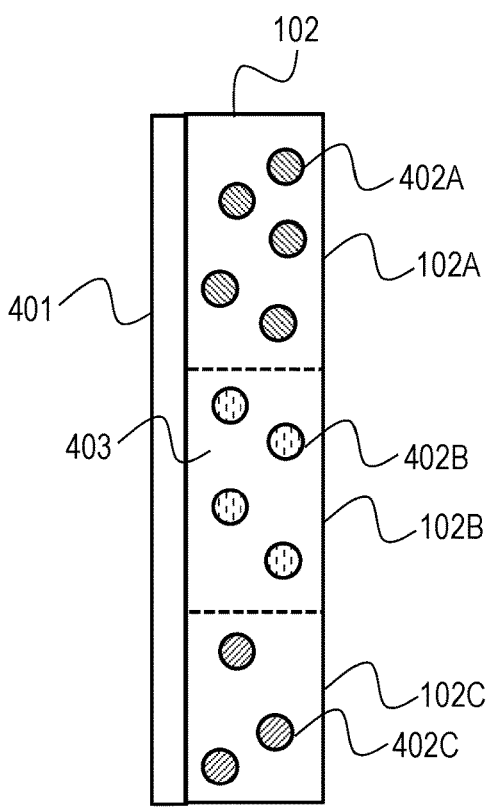
FIG. 4B is a diagram for describing a configuration of a fluorescent film.

Finally, a specific configuration of the fluorescent film 102 will be described with reference to FIGS. 4A and 4B. In the present embodiment, colloidal quantum dots (hereinafter, referred to as quantum dots) are used for manufacturing the fluorescent film 102. The quantum dots are nanoparticles of CdSe, ZnS, CdS, Si, PbS, PbSe, InAs, InP or other semiconductors with sizes of about 1 to 10 nm and have high luminous efficiency by covering surfaces of the quantum dots with an organic compound. Further, the emission wavelength can be changed by changing the size of the nanoparticles without changing the type of semiconductors. FIGS. 4A and 4B illustrate the fluorescent film 102 configured from the quantum dots, and the configuration of FIG. 4B can obtain higher luminous efficiency than the configuration of FIG. 4A. First, a configuration of common part will be described with reference to FIG. 4A. The fluorescent film 102 is manufactured by applying quantum dots 402A to 402C having different sizes and emission wavelengths onto a substrate 401. In this example, the quantum dots 402A, the quantum dots 402B, and the quantum dots 402C emit light with shorter wavelengths in descending order. The substrate 401 is made of a material that does not absorb the lights 108A to 108C generated by the scintillator 101. For example, quartz can be used for the substrate 401. Further, since the quantum dots 402A to 402C are soluble in an organic solvent, methods such as inkjet printing and spin coating can be considered as application methods. Application by ink jet printing is excellent in arrangement resolution. The film thickness of the fluorescent film 102 is adjusted according to the type of the quantum dots 402A to 402C constituting the film so that absorption rates for the lights 108A to 108C become equal. Quantum dots that emit light with short wavelengths have smaller light absorption rates than quantum dots that emit light at longer wavelengths. Therefore, the phosphor 102A including the quantum dots 402A is set to be thicker than the phosphor 102B including the quantum dots 402B, and the phosphor 102B is set to be thicker than the phosphor 102C including the quantum dots 402C. Meanwhile, if the fluorescent film 102 is thicker than a certain thickness, the lights 109A to 109C emitted by the phosphors are lost due to scattering or the like, and thus the thickness of the phosphors 102A to 102C is desirably a minimum thickness that absorbs the lights 108A to 108C. For example, to cause the phosphors 102A to 102C to absorb 95% of the lights 108A to 108C respectively, the thickness thereof can be determined to satisfy Equation (3).

[Equation 3]

$$e^{-\alpha_A \times d_A} = e^{-\alpha_B \times d_B} e^{-\alpha_C \times d_C} = 0.95 \quad \text{(Equation 3)}$$

Here, $\alpha_A$ to $\alpha_C$ are absorption coefficients of the phosphors 102A to 102C, respectively, and $d_A$ to $d_C$ are thicknesses of the phosphors 102A to 102C, respectively.

Here, when the quantum dots 402A to 402C aggregate, the luminous efficiency is reduced. Therefore, it is not desirable to manufacture the fluorescent film 102 with quantum dots alone. Therefore, in the configuration of FIG. 4B, reduction in the luminous efficiency of the quantum dots 402A to 402C is suppressed by using a transparent matrix such as a polymer. As an application method, a technique such as inkjet printing can be applied, similarly to the configuration of FIG. 4A. The configuration of FIG. 4B is also configured on the substrate 401 as in the configuration of FIG. 4A. However, the quantum dots 402A to 402C are dispersed in a transparent matrix 403 transparent with respect to the lights 108A to 108C and the lights 109A to 109C. By dispersing the quantum dots in the transparent matrix 403 such as a polymer, the reduction in the luminous efficiency due to aggregation of the quantum dots 402A to 402C can be suppressed. In this case, by adjusting the density of the quantum dots 402A to 402C in the transparent matrix 403 and equalizing absorption coefficients of the phosphors 102A to 102C, the absorption rates for the lights 108A to 108C can be equalized with the same film thickness.

Note that, in the examples of FIGS. 4A and 4B, the quantum dots having different sizes are used for the fluorescent film 102. However, any phosphors can be used as long as the phosphors have different emission wavelengths. Further, an embodiment is not limited to the configuration in which the phosphors 102A to 102C are applied on the substrate 401, and may be applied on the scintillator 101 or the waveguide 104, or the fluorescent film 102 alone may be adopted without using the substrate 401.

With the above configuration, a position discrimination detector capable of stably detecting a detection signal despite using a coloring matter containing an organic compound that is not resistant to electron beams. Hereinafter, modifications for improving performance of the position discrimination detector will be described.

Figure 5:
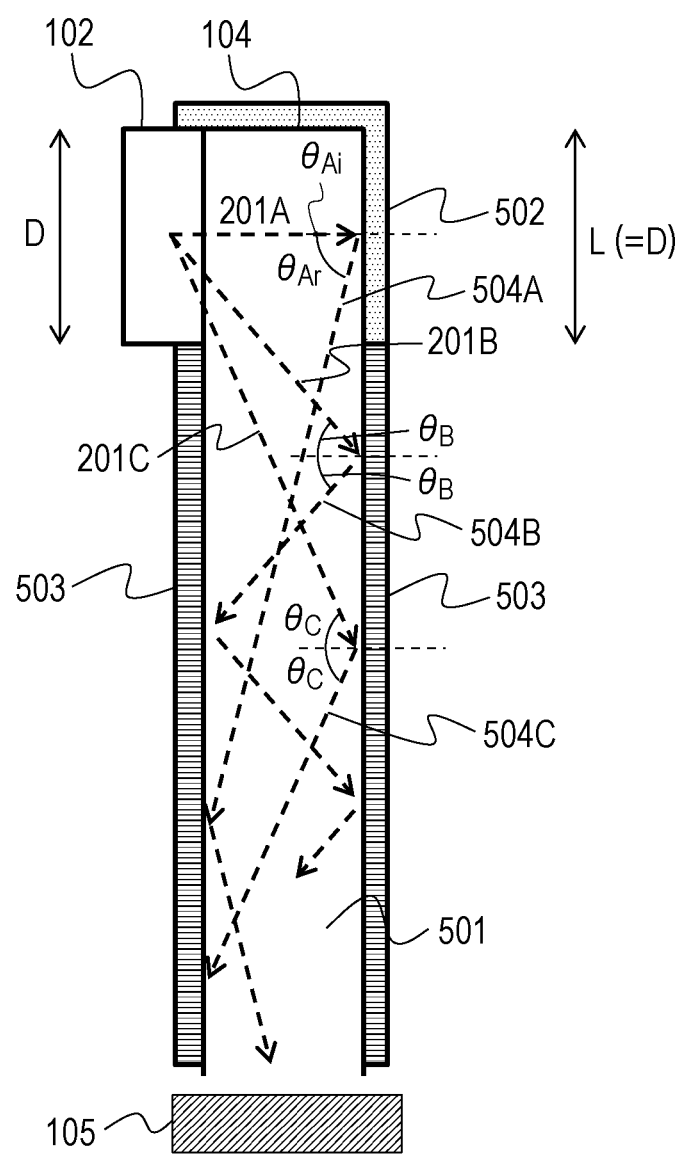
FIG. 5 is a diagram for describing another configuration of the waveguide.

As described with reference to FIG. 2, in the waveguide 104, some light having an incident angle less than the critical angle leaks out of the waveguide. This means signal degradation of the charged particle detector. Therefore, FIG. 5 illustrates a configuration example of a waveguide 501 that propagates light from a fluorescent film 102 to a color filter 105 while suppressing light leakage.

The waveguide 501 is provided with a light diffusion reflective film 502 and a light specular reflective film 503 on a waveguide main body 104. An end surface of the waveguide main body 104 on a side of the fluorescent film 102 is covered with the light diffusion reflective film 502. No reflective film is provided on an end surface facing the color filter 105. The light diffusion reflective film 502 is provided on a side surface of the waveguide main body 104 facing the fluorescent film 102, and the other side surfaces of the waveguide main body 104 are covered with the light specular reflective film 503. A height L of the light diffusion reflective film on the side surface of the waveguide main body 104 is equal to a length D of the fluorescent film 102.

Next, a light propagation path inside the waveguide 501 will be described. The lights 201A to 201C emitted by the fluorescent film 102 enter the waveguide 501. The light 201A enters the light diffusion reflective film 502 at an incident angle $\theta_{Ai}$ and the lights 201B and 201C enter the light specular reflective film 503 at angles $\theta_B$ and $\theta_C$. Since the light diffusion reflective film 502 reflects the incident light in random directions, the light 201A is diffused without being transmitted when the light 201A perpendicularly enters the light diffusion reflective film ($\theta_{Ai}=0$), and is diffused and reflected as a light 504A having an angle $\theta_{Ar}$, and then propagated in the waveguide 501. Further, when the lights 201B and 201C enter the light specular reflective film 503 at angles $\theta_B$ and $\theta_C$, respectively, the lights 201B and 201C are specularly reflected and emitted at the same angles $\theta_B$ and $\theta_C$ and propagated in the waveguide 501 while repeating specular reflection as lights 504B and 504C. All of the lights 504A to 504C are propagated in the waveguide 501 and reach the color filter 105 in this way. By using the light diffusion reflective film 502 and the light specular reflective film 503 as described above, leakage of the lights 201A to 201C can be prevented and signal deterioration of the charged particle detector can be suppressed.

Figure 6:
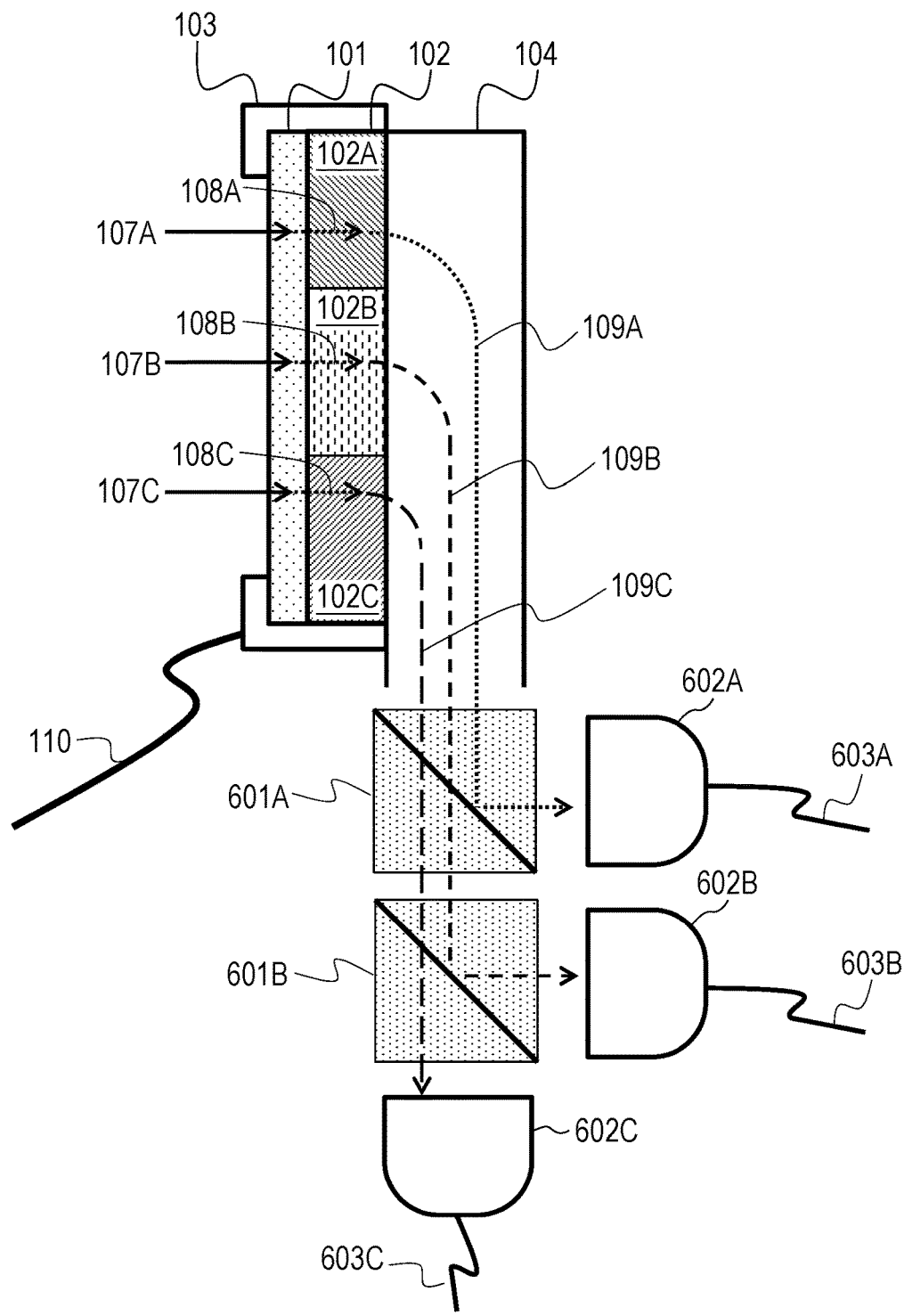
FIG. 6 is a diagram for describing another method of selecting detection light by a color filter.

Next, a different method of selecting detection light from the color filter will be described. In FIG. 3A, intensity distribution of electron beams radiated on different positions of the scintillator is measured by using the color filter as an optical element for selecting luminescence of the phosphors and switching the wavelength filters 301A to 301C. Therefore, it is necessary to measure the intensity distribution for each wavelength filter 301, and the measurement time becomes longer according to the number of wavelength filters. In FIG. 6, a charged particle beam detector capable of shortening the intensity distribution measurement time of electron beams radiated on a scintillator by simultaneously detecting lights 109A to 109C having different wavelengths generated from a fluorescent film 102 by a plurality of photodetectors will be described.

In the detector of FIG. 6, dichroic mirrors 601A and 601B are provided as optical elements for selecting luminescence of the phosphors, and a plurality of photodetectors 602A to 602C are provided. The lights 109A to 109C propagated in a waveguide 104 enter the dichroic mirror 601A. A dichroic mirror is a mirror having a property to reflect only light in a certain range of wavelengths and transmit other lights. The dichroic mirror 601A reflects the light 109A and transmits the lights 109B and 109C. The reflected light 109A is detected by the photodetector 602A. Lights 109B and 109C transmitted through the dichroic mirror 601A enter the dichroic mirror 601B. The dichroic mirror 601B reflects the light 109B and transmits the light 109C. The reflected light 109B is detected by the photodetector 602B, and the transmitted light 109C is detected by the photodetector 602C. Outputs of the photodetectors 602A to 602C are output via output cables 603A to 603C.

In this manner, by simultaneously measuring the luminescence from phosphors 102A to 102C by the separate photodetectors 602A to 602C, the electron beam irradiation intensity on the scintillator can be measured at a time, and the measurement time can be shortened. Note that separation of lights having different wavelengths is not limited to the dichroic mirrors, and, for example, a prism or the like may be used.

Next, a configuration to correct variation in the luminous efficiency of the fluorescent film 102 to improve stability of the position discrimination detector will be described. The luminous efficiency of the fluorescent film 102 is not stabilized due to light irradiation or vacuum and varies over a long period even if the fluorescent film 102 is not directly irradiated with the charged particles. This variation in the luminous efficiency leads to variation in current output by the photodetector 106, which means that the position discrimination detector is not stabilized over a long period. Therefore, in the configuration of FIG. 7, variation in the luminous efficiency of a fluorescent film 102 is measured, and a signal amplifier for correcting a final output value according to a measurement value is included, thereby to improve stability of a position discrimination detector.

Figure 7:
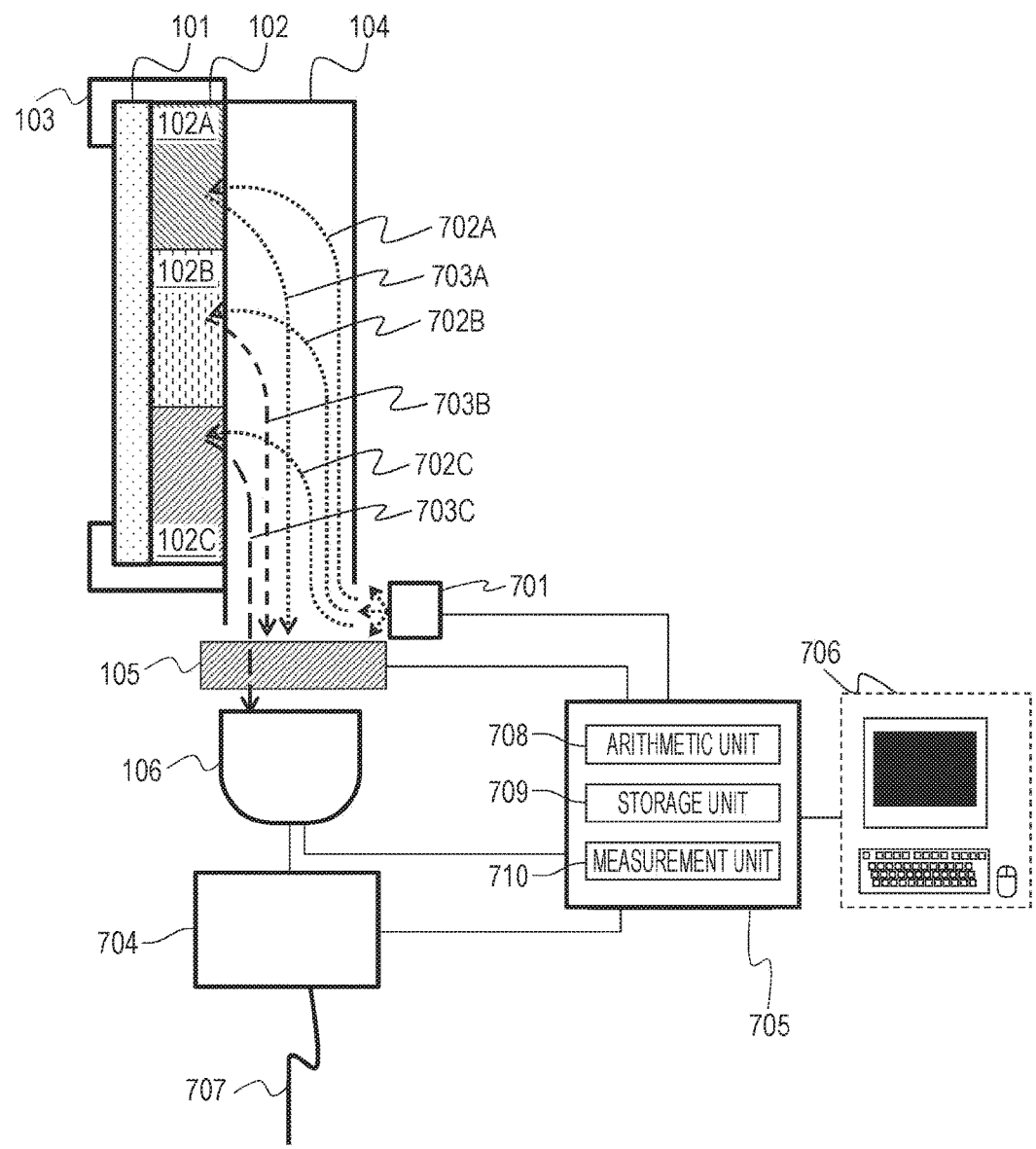
FIG. 7 is a diagram for describing a configuration for correcting variation in luminous efficiency of a fluorescent film.

The configuration illustrated in FIG. 7 includes a light source 701 that excites the fluorescent film 102 through a waveguide 104 and a signal amplifier 704 that amplifies an output of a photodetector 106 and outputs the amplified output as a final output value via an output cable 707, in addition to the position discrimination detector in FIG. 1. Therefore, the final output value of the position discrimination detector in FIG. 7 is a product of an output of the photodetector 106 and an amplification factor of the signal amplifier.

The light source 701, the color filter 105, the photodetector 106, and the signal amplifier 704 are controlled by a system control unit 705. A user controls the position discrimination detector via a user terminal 706. Further, the system control unit 705 includes an arithmetic unit 708, a storage unit 709, and a measurement unit 710. The measurement unit 710 detects outputs of the photodetector 106 and the signal amplifier 704, and the arithmetic unit 708 calculates the amplification factor of the signal amplifier 704 on the basis of setting stored in the storage unit 709 upon receipt of the output values. Note that, as will be described below, the amplification factor of the signal amplifier 704 is usually different depending on the wavelength filters 301A to 301C.

A method of measuring the luminous efficiency of the fluorescent film 102 will be described. In the configuration of FIG. 7, the luminous efficiency of the fluorescent film 102 is measured by exciting the fluorescent film 102 with the light source 701 and measuring the amount of luminescence. In a case of detecting the charged particle beam, the fluorescent film 102 is excited using the luminescence 108 of the scintillator 101. Here, to measure the luminous efficiency of the fluorescent film 102, the fluorescent film 102 needs to be excited with light of a certain known amount. Therefore, the fluorescent film 102 is directly excited by the light source 701 from a side of the waveguide 104, and excitation of the fluorescent film 102 by incidence of the charged particle beam on the scintillator 101 is caused by the light source 701 in a pseudo manner.

The process of measuring the amount of luminescence of the fluorescent film 102, using the light source 701, will be described. Lights 702A to 702C generated from the light source 701 are propagated in the waveguide 104, enter the fluorescent film 102, and are absorbed by the phosphors 102A to 102C. Note that the wavelength of the light generated from the light source 701 is desirably the same as the emission wavelength of the light 108. However, light with a different wavelength may be adopted as long as the light can excite the phosphors 102A to 102C to emit light. Note that a difference in luminous efficiency due to the difference in the wavelength of the exciting light needs to be corrected. When the phosphors 102A to 102C absorb the light 702A to 702C, the phosphors 102A to 102C respectively emit lights 703A to 703C corresponding to the light 702A to 702C. Since the emission wavelengths of the phosphors 102A to 102C do not depend on the wavelength of the exciting light, the wavelengths of the lights 703A to 703C are the same as those of the lights 109A to 109C that are obtained by exciting the fluorescent film using the luminescence of the scintillator 101. Therefore, the lights 703A to 703C are propagated in the waveguide 104, selected in wavelength by the color filter 105, and detected by the photodetector 106. The output value of the photodetector 106 at this time is taken as the luminous efficiency of the phosphors 102A to 102C corresponding to the wavelength selected by the color filter 105. By switching the color filter 105, the luminous efficiency can be measured for each of the phosphors 102A to 102C.

Figure 8:
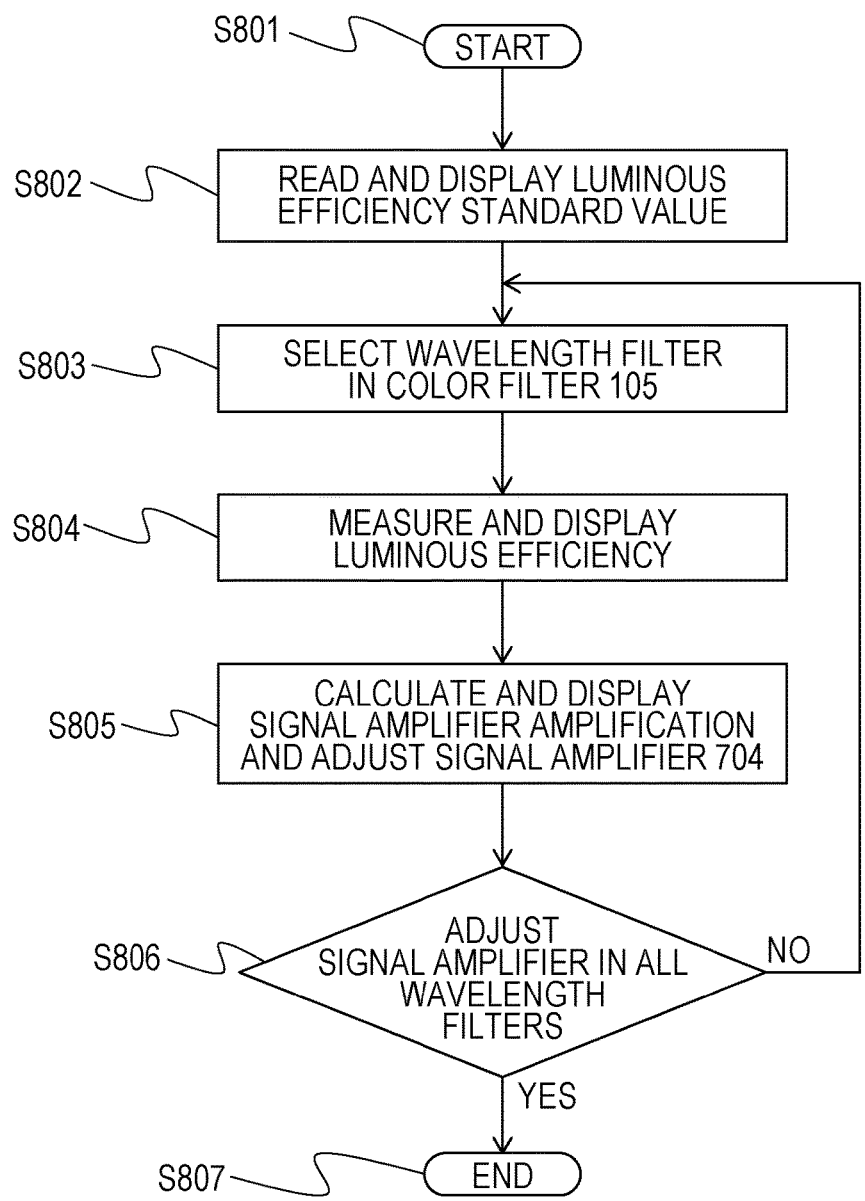
FIG. 8 is a flowchart for adjusting an amplification factor of a signal amplifier.
Figure 9:
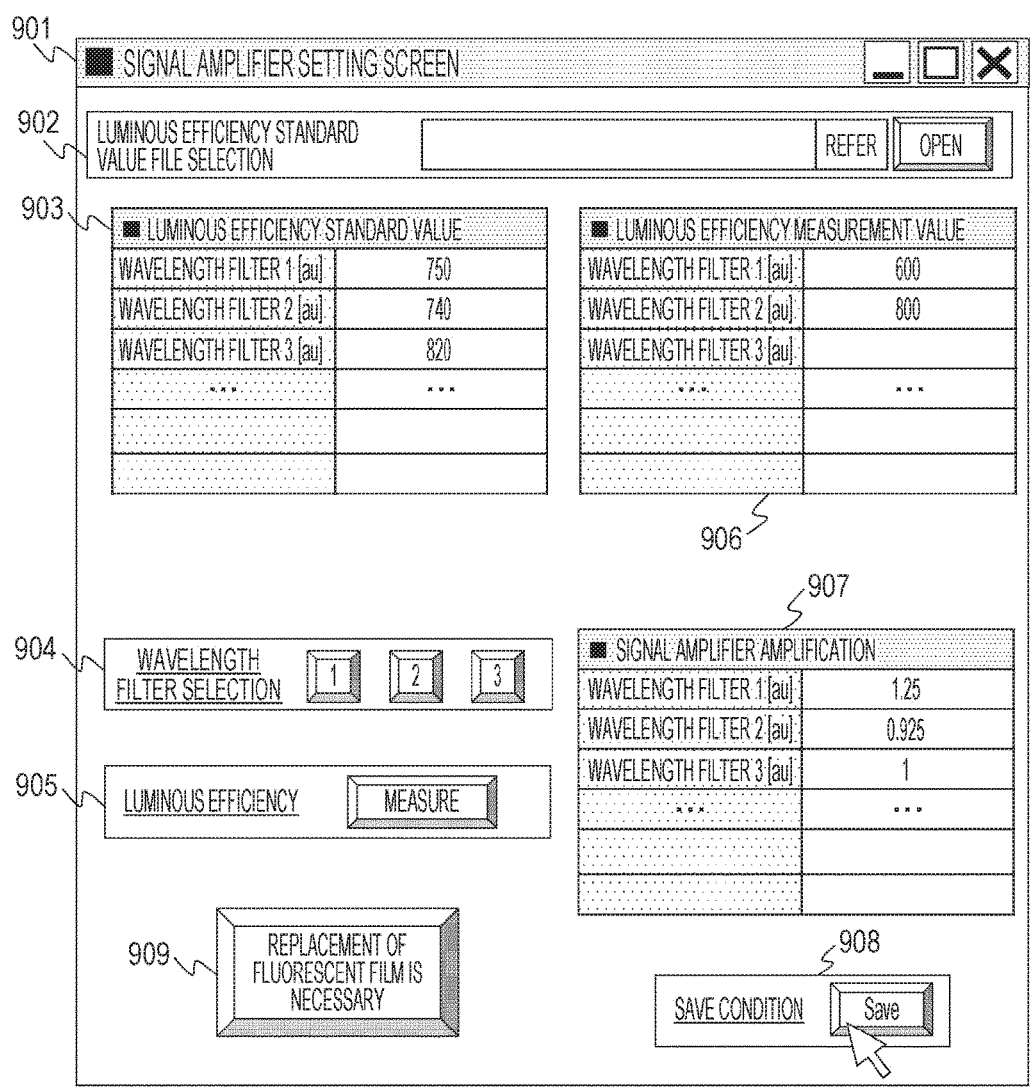
FIG. 9 is a setting screen for adjusting the signal amplifier.

To stabilize an unstable output of the position discrimination detector due to variation in the luminous efficiency of the phosphors 102A to 102C, the amplification factor of the signal amplifier 704 is adjusted. A procedure of adjusting the signal amplifier 704 will be described with reference to the flowchart illustrated in FIG. 8 and a signal amplifier setting screen illustrated in FIG. 9. When the user selects the signal amplifier setting screen via the user terminal 706, a signal amplifier setting screen 901 as illustrated in FIG. 9 is displayed on the screen of the user terminal 706 (S801). For the adjustment of the signal amplifier 704, a luminous efficiency standard value is used as a baseline for adjustment. The luminous efficiency standard value is the luminous efficiency of each of the phosphor 102A to 102C before variation in the luminous efficiency, which is measured in advance using each of the wavelength filters 301A to 301C before the variation in the luminous efficiency, and is stored in the storage unit 709. When the user selects the luminous efficiency standard values of the phosphors 102A to 102C using a luminous efficiency standard value file selection frame 902 on the signal amplifier setting screen 901, the system control unit 705 reads the luminous efficiency standard values from the storage unit 709 and displays the values in a luminous efficiency standard value frame 903 (S802). Next, when the system control unit 705 selects one of the wavelength filters in order to measure the variation in the luminous efficiency of each of the phosphors 102A to 102C, the selected wavelength filter is identifiably displayed from others in a wavelength filter selection frame 904 on the signal amplifier setting screen 901 (S803). After that, a measurement button in a luminous efficiency measurement frame 905 is lit, and the system control unit 705 performs the luminous efficiency measurement described above. That is, the system control unit 705 excites the fluorescent film 102 by turning on the light source 701, measures the luminous efficiency of the phosphor selected in the photodetector 106, stores the value in the storage unit 709, and displays the value in a luminous efficiency measurement value frame 906 (S804). After the measurement, the light source 701 is controlled to be turned OFF by the system control unit 705.

Here, when there is variation in the luminous efficiency, the luminous efficiency measurement value varies from the luminous efficiency standard value in each of the wavelength filters. The arithmetic unit 708 calculates the signal amplifier amplification as a ratio of the luminous efficiency standard value to the luminous efficiency measurement value (the luminous efficiency standard value/luminous efficiency measurement value) from the values stored in the storage unit 709, adjusts the signal amplifier 704, and displays the calculated value in a signal amplifier amplification frame 907 on the signal amplifier setting screen 901 through the system control unit 705 (S805).

The system control unit 705 performs adjustment of the signal amplifier for all the wavelength filters 301A to 301C by repeating 5803 to 5805 (S806). When the user presses a condition saving button 908, the obtained amplification factor of the signal amplifier 704 is saved in the storage unit 709 and the adjustment is terminated (S807). Note that, when the fluorescent film 102 is deteriorated and the luminous efficiency measurement value becomes 70% or less of the luminous efficiency standard value, a fluorescent film replacement button 909 that urges replacement of the fluorescent film is lit up.

By setting the signal multiplied by the signal amplifier 704 with the amplification factor set in the above manner as the final output value, influence of the luminous efficiency of the phosphors 102A to 102C on the final output value can be suppressed. For example, by adjusting the signal amplifier 704 on a regular basis, the stability of the position discrimination detector can be improved.

The above-described modifications are applicable alone and are also applicable in appropriate combination.

Second Embodiment

In a second embodiment, an example in which the position discrimination detector described in the first embodiment is mounted on a scanning electron microscope as an example of a charged particle beam device will be described. In the scanning electron microscope, an arrangement space for a charged particle detector is limited. Therefore, it is difficult to arrange a conventional type detector in a place where abundant sample information can be acquired, for example, under an objective lens. In contrast, the compact position discrimination detector described in the first embodiment can be arranged under an objective lens, and can detect while discriminating arrival positions of secondary electrons.

Figure 10:
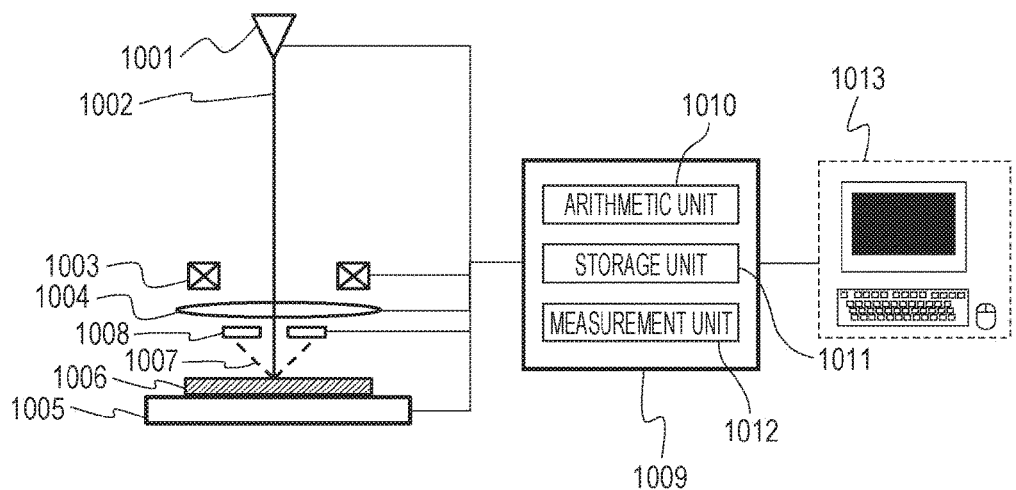
FIG. 10 is a diagram illustrating a configuration of a scanning electron microscope including a position discrimination detector.

A device configuration of the second embodiment will be described with reference to FIG. 10. FIG. 10 illustrates a device configuration of a scanning electron microscope equipped with a position discrimination detector under an objective lens. A scanning deflector 1003 and an objective lens 1004 are provided on a locus of a primary beam 1002 drawn from an electron source 1001. The primary beam 1002 radiated on a sample 1006 placed on a sample conveyance stage 1005 interacts with a substance near a surface of the sample 1006 to generate secondary electrons 1007. A position discrimination detector 1008 for detecting secondary electrons is provided under the objective lens 1004, and an opening is provided in the center of the position discrimination detector 1008 so that the primary beam 1002 passes therethrough. The electron source 1001, the scanning deflector 1003, the objective lens 1004, the sample conveyance stage 1005, and the position discrimination detector 1008 are controlled by a system control unit 1009. An arithmetic unit 1010, a storage unit 1011, and a measurement unit 1012 are arranged in the system control unit 1009, and the system control unit 1009 is connected to a user terminal 1013 having an image display device.

The primary beam 1002 emitted from the electron source 1001 is controlled by the objective lens 1004 and is focused on the sample 1006 such that a beam diameter is minimized. The scanning deflector 1003 is controlled by the system control unit 1009 such that the primary beam 1002 scans a predetermined area of the sample 1006. The primary beam 1002 that has reached the surface of the sample 1006 interacts with the substance near the surface. With the interaction, reflected electrons, secondary electrons, Auger electrons, and the like are generated from the sample. Here, a case in which so-called true secondary electrons (secondary electrons directly excited by primary electrons and released into vacuum) are detected as a signal by the position discrimination detector will be described. The secondary electrons 1007 generated from the position where the primary beam 1002 has reached on the sample 1006 are detected by the position discrimination detector 1008. Signal processing of the secondary electrons 1007 detected from the position discrimination detector 1008 is performed in synchronization with a scanning signal sent from the system control unit 1009 to the scanning deflector 1003, whereby an SEM image is formed. Although not illustrated, an aligner for correcting an optical axis of an electron gun is arranged between the electron source 1001 and the objective lens 1004, and when a central axis of the electron beam is shifted with respect to a diaphragm or an electron optical system, correction can be made.

In a case of application to a scanning electron microscope, stability of the position discrimination detector is important. Therefore, the configuration of the position discrimination detector 1008 is desirably similar to the configuration illustrated in FIG. 7. That is, the configuration includes a light source for exciting a fluorescent film and a signal amplifier for amplifying an output of a photodetector, and improves the stability of the position discrimination detector 1008 by controlling a signal amplifier amplification factor. Therefore, regarding the control of the position discrimination detector, the system control unit 1009, and the arithmetic unit 1010, the storage unit 1011, the measurement unit 1012, and the user terminal 1013 provided inside the system control unit 1009 have the same functions as the system control unit 705, and the arithmetic unit 708, the storage unit 709, the measurement unit 710, and the user terminal 706 of the position discrimination detector describe in FIG. 7. With the configuration, a user can adjust the amplification factor of the signal amplifier of the position discrimination detector 1008 via a signal amplifier setting screen (see FIG. 9) displayed on the user terminal 1013 according to the procedure described with reference to FIG. 7. Since the adjustment procedure and the GUI are as described above, description thereof is omitted here.

Figure 11:
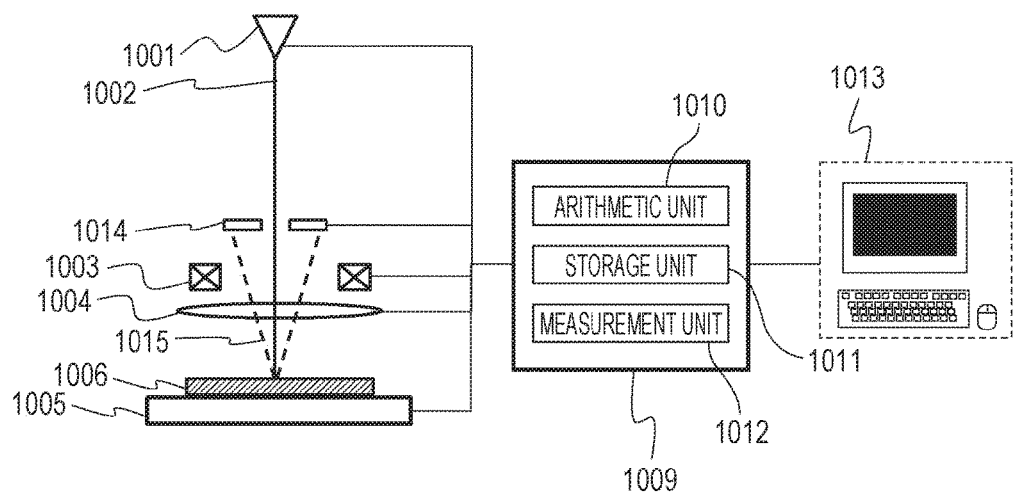
FIG. 11 is a diagram for describing another configuration of the scanning electron microscope including a position discrimination detector.
Figure 12:
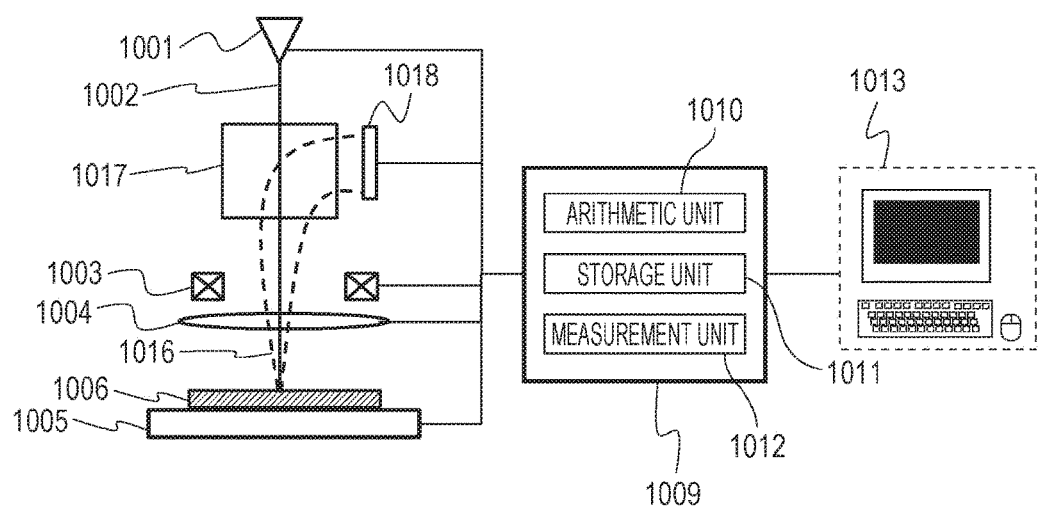
FIG. 12 is a diagram for describing another configuration of the scanning electron microscope including a position discrimination detector.

The position discrimination detector can be arranged in a location different from the configuration illustrated in FIG. 10, and description will be given below. By changing the space where the position discrimination detector is arranged, a range of the detected secondary electrons can be changed. Representative configuration examples are illustrated in FIGS. 11 and 12. Device configurations illustrated in FIGS. 10 to 12 are substantially the same but installation positions of the position discrimination detector in the scanning electron microscope are different. In FIG. 11, a position discrimination detector 1014 is arranged above the objective lens 1004. FIG. 12 illustrates an example in which a position discrimination detector 1018 is arranged in a position separated from the primary beam. In the device of FIG. 12, a beam separator 1017 for largely separating secondary electrons 1016 from the primary beam 1002 by a magnetic field or a combination of a magnetic field and an electric field is provided to separate secondary electrons from the primary beam. By disposing the position discrimination detector 1018 downstream of the beam separator 1017 as viewed from the secondary electrons 1016, the secondary electrons 1016 separated from the primary beam 1002 can be detected for each arrival position.

By disposing the position discrimination detector in this manner, a SEM image can be acquired changing a range of the secondary electrons desired to obtain. Note that FIGS. 10 to 12 illustrate examples in which one type of detector is arranged. However, a plurality of position discrimination detectors may be arranged in combination, or some of the plurality of detectors may be combined as a general detector. The configuration and the procedure for improving the stability of the position discrimination detector required at that time are similar to those described regarding the position discrimination detector under the objective lens illustrated in FIG. 10, and thus description is omitted.

As described above, in a charged particle beam device such as a scanning electron microscope, charged particles (secondary electrons) can be detected for each arrival position in a limited space and an observation image can be formed.

What is claimed is:

1. A charged particle detector comprising:
   a scintillator that is irradiated with charged particles;
   a fluorescent film being in contact with a first surface facing a second surface of the scintillator, the second surface being irradiated with the charged particles; and
   a photodetector configured to detect luminescence of the fluorescent film, wherein
   the fluorescent film has a plurality of regions, the plurality of regions respectively have phosphors that absorb luminescence of the scintillator and emit light with different wavelengths from one another.

2. The charged particle detector according to claim 1, wherein
   the phosphor is a phosphor containing an organic compound.

3. The charged particle detector according to claim 2, wherein
   the phosphor is quantum dots covered with the organic compound, and
   the fluorescent film has a matrix, and the quantum dots are dispersed in the matrix.

4. The charged particle detector according to claim 1, further comprising:
   an optical element configured to selectively transmit or reflect luminescence of the phosphor of any of the plurality of regions, wherein
   the photodetector detects light transmitted through or reflected at the optical element.

5. The charged particle detector according to claim 4, further comprising:
   a waveguide configured to propagate the light emitted by the fluorescent film to the optical element.

6. The charged particle detector according to claim 5, wherein
   an end surface of the waveguide on a side of the fluorescent film and a side surface of the waveguide, the side surface facing the fluorescent film, are covered with a light diffusion reflective film, and
   a side surface of the waveguide, the side surface not facing the fluorescent film, is covered with a light specular reflective film.

7. The charged particle detector according to claim 1, further comprising:
   a light source configured to excite the fluorescent film from a surface facing a surface in contact with the scintillator; and
   a signal amplifier configured to amplify an output signal of the photodetector, wherein
   the signal amplifier amplifies and outputs the output signal of the photodetector by signal amplifier amplification set on the basis of preset luminous efficiency and luminous efficiency measured by exciting the fluorescent film by the light source, for each of the phosphors of the plurality of regions.

8. The charged particle detector according to claim 7, wherein
   an emission wavelength of light emitted by the light source is equal to an emission wavelength of light emitted by the scintillator.

9. The charged particle detector of claim 1, further comprising:
   a conductive housing that surrounds the scintillator and the fluorescent film.

10. A charged particle beam device comprising:
    a charged particle source;
    a stage on which a sample is arranged;
    an objective lens configured to focus a primary charged particle beam emitted from the charged particle source onto the sample arranged on the stage; and
    a charged particle detector configured to detect secondary charged particles generated by irradiating the sample with the primary charged particle beam, wherein the charged particle detector includes a scintillator that is irradiated with the secondary charged particles, a fluorescent film being in contact with a first surface facing a second surface of the scintillator, the second surface being irradiated with the secondary charged particles, and a photodetector configured to detect luminescence of the fluorescent film, and the fluorescent film has a plurality of regions, the plurality of regions respectively have phosphors that absorb luminescence of the scintillator and emit light with different wavelengths from one another.

11. The charged particle beam device according to claim 10, wherein
    the charged particle detector is arranged in a space between the objective lens and the stage.

12. The charged particle beam device according to claim 10, wherein
    the charged particle detector includes a light source that excites the fluorescent film from a surface facing a surface in contact with the scintillator, and a signal amplifier that amplifies an output signal of the photodetector, and the signal amplifier amplifies and outputs the output signal of the photodetector by signal amplifier amplification set on the basis of preset luminous efficiency and luminous efficiency measured by exciting the fluorescent film by the light source, for each of the phosphors of the plurality of regions.

13. The charged particle beam device according to claim 12, further comprising:
a system control unit configured to set the signal amplifier amplification of the signal amplifier, wherein
the system control unit includes a storage unit that stores a luminous efficiency standard value for each of the phosphors of the plurality of regions, a measurement unit that causes the light source to emit light and measures the luminous efficiency for each of the phosphors of the plurality of regions, and an arithmetic unit that sets the signal amplifier amplification for each of the phosphors of the plurality of regions on the basis of the luminous efficiency standard value and the luminous efficiency measured by the measurement unit.

14. The charged particle beam device according to claim 13, wherein
the luminous efficiency standard value is the luminous efficiency of each of the phosphors of the plurality of regions, the luminous efficiency having been measured in advance before variation of the luminous efficiency.

* * * * *